United States Patent
Kobayashi

(10) Patent No.: US 6,700,159 B2
(45) Date of Patent: Mar. 2, 2004

(54) SEMICONDUCTOR DEVICE COMPRISING TRENCH-ISOLATED TRANSISTORS

(75) Inventor: Kiyoteru Kobayashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/988,177

(22) Filed: Nov. 19, 2001

(65) Prior Publication Data

US 2003/0001204 A1 Jan. 2, 2003

(30) Foreign Application Priority Data

Jun. 27, 2001 (JP) ......................... 2001-194519

(51) Int. Cl.$^7$ ............................... H01L 29/76
(52) U.S. Cl. ................. 257/332; 257/301; 257/302; 257/303; 257/304; 257/305
(58) Field of Search ............... 257/316–322, 257/915, 301–305, 332

(56) References Cited

U.S. PATENT DOCUMENTS

| | | | | |
|---|---|---|---|---|
| 4,571,819 A | * | 2/1986 | Rogers et al. | 438/430 |
| 5,342,792 A | * | 8/1994 | Yonehara | 438/386 |
| 5,702,977 A | * | 12/1997 | Jang et al. | 216/38 |
| 5,869,868 A | * | 2/1999 | Rajeevakumar | 257/350 |
| 5,969,393 A | * | 10/1999 | Noguchi | 257/396 |
| 6,136,664 A | * | 10/2000 | Economikos et al. | 438/431 |
| 6,140,251 A | * | 10/2000 | Arghavani et al. | 438/778 |
| 6,147,378 A | * | 11/2000 | Liu et al. | 257/316 |
| 6,265,307 B1 | * | 7/2001 | Lou | 438/633 |
| 6,323,106 B1 | * | 11/2001 | Huang et al. | 438/433 |
| 6,358,796 B1 | * | 3/2002 | Lin et al. | 438/257 |
| 6,414,364 B2 | * | 7/2002 | Lane et al. | 257/397 |
| 2001/0001723 A1 | * | 5/2001 | Gardner et al. | 438/305 |
| 2002/0028578 A1 | * | 3/2002 | Lu et al. | 438/683 |
| 2002/0090804 A1 | * | 7/2002 | McTeer | 438/612 |

OTHER PUBLICATIONS

K, Shimizu, K. Narita, H. Watanabe, E. Kamiya, Y. Takeuchi, T. Yaegashi, S. Aritome, and t. Watanabe, A Novel High–Density 5F$^2$ NAND STI Cell Technology Suitable For 256Mbit and 1 Gbit Flash Memories, IEDM, Dec. 7–10, 1997, pp. 271–274.

Takashi Kobayashi, Nozomu Matsuzaki, Akihiko Sato, Atsuko Katayama, Hideaki Kurata, Akemi Miura, Toshiyuki Mine, Yasushi Goto, Tadao Morimoto, Hitoshi Kume, Tokuo Kure, and Katsutaka Kimura, "A 0.24 $\mu$m$^2$ Cell Process with 0.18 $\mu$m Width Isolation and 3–D Interpoly Dielectric Films for 1–Gb Flash Memories," IEDM, 1997, pp. 275–278.

Masataka Kato, Tetsuo Adachi, and Toshihiro Tanaka, "A Shallow–Trench–Isolation Flash Memory Technology With A Source–Bias Programming Method," IEDM, 1996, pp. 177–180.

(List continued on next page.)

*Primary Examiner*—Amir Zarabian
*Assistant Examiner*—Ida M. Soward
(74) *Attorney, Agent, or Firm*—McDermott, Will & Emery

(57) ABSTRACT

The present invention provides a highly reliable semiconductor device including a silicon substrate, floating gate electrodes with side walls formed on first surface of silicon substrate with a gate insulator film disposed therebetween, first and second side-wall insulator layers formed on side walls and on a portion of first surface, and a nitrogen-containing extending from the portion of silicon substrate that is in the vicinity of second surface to the portion of silicon substrate that is in the vicinity of the interface between first and second side-wall insulator layers and silicon substrate.

7 Claims, 10 Drawing Sheets

OTHER PUBLICATIONS

S. Aritome, S. Satoh, T. Maruyama, H. Watanabe, S. Shuto, G.J. Hemink, R. Shirota, S. Watanabe, and F. Masuoka, "A 0.67 $\mu m^2$ Self–Aligned Shallow Trench Isolation Cell (SA–STI Cell) for 3V–Only 256Mbit NAND EEPROMs," IEDM, 1994, pp. 61.64.

Seiichi Aritome, Yuki Takeuchi, Shinji Sato, Hiroshi Watanabe, Kazuhiro Shimizu, Gertjan Hemink, and Riichiro Shirota, A Novel Side–Wall Transfer–Transistor Cell (SWATT Cell) For Multi–Level Nand EEPROMs,:IEDM 1995, pp. 275–278.

Jung–Dal Choi, Joon–Hee Lee, Won–Hong Lee, Kwangshik Shin, Yong–Sik Yim, Jae–Duk Lee, Yoo–Cheol Shin, Sung–Nam Chang, Kyu–Charn Park, Jong–Woo Park, and Chang–Gyu Hwang, "A 0.15 m NAND Flash Technology with 0.11 $m^2$ Cell Size for 1 Gbit Flash Memory,"IEDM, 2000, No. 5pp. 767–770.

Seiichi Aritome, "Advanced Flash Memory Technology and Trends For File Storage Application," IEDM, Dec. 10–13, 2000, No. 6, pp. 763–766.

Akira Goda, Wakako Moriyama, Hiroaki Hazama, Hiroshisa Iizuka, Kazuhiro Shimizu, Seiichi Aritome, and Riichiro Shirota, "A Novel Surface–Oxidized Barrier–SiN Cell Technology To Improve Endurance and Read–Disturb Characteristics For Gigabit NAND Flash Memories," IEDM, Dec. 10–13, 2000, No. 7, pp. 771–774.

F. Arai, N. Arai, S. Satoh, T. Yaegashi, E. Kamiya, Y.Matsunaga, Y. Takeuchi, H. Kamata, A. Shimizu, N. Ohtani, N. Kai, S. Takahashi, W. Moriyama, K. Kugimiya, S. Miyazaki, T. Hirose, H. Meguro, K. Hatakeyama, K. Shimizu, and R. Shiirota, "High–Density (4.4$F^2$) NAND Flash Technology Using Super–Shallow Channel Profile (SSCP) Engineering", IEDM, Dec. 10–13, 2000, No. 8, pp. 775–778.

Y. Takeuchi, K. Shimizu, K. Narita, E. Kamiya, T. Yaegashi, K. Amemiya, and S. Aritome, "A Self–Aligned STI Process Integration For Low Cost And Highly Reliable 1Gbit Flash Memories," Symposium On VLSI Technology Digest Of Technical Papers, 1998, No. 4, pp. 102–103.

* cited by examiner

CONCENTRATION
OF NITROGEN
ON LINE A-A

SEMICONDUCTOR DEVICE COMPRISING TRENCH-ISOLATED TRANSISTORS

BACKGROUND OF THE INVENTION

1. Field of the Invention

The present invention relates to a semiconductor device and a method for fabricating the same. More specifically, the present invention relates to a semiconductor device comprising trench-isolated transistors and a method for fabricating the same.

2. Description of the Background Art

Semiconductor devices provided with a plurality of transistors isolated by trenches have been widely known, and one such device is disclosed in "A Shallow-Trench-Isolation Flash Memory Technology with a Source-Bias Programming Method" IEDM, pp.177–180, 1996.

FIG. 11 shows a cross sectional view of the prior art semiconductor device disclosed in the above-mentioned literature. Referring to FIG. 11, the prior art semiconductor device has a plurality of trenches 101h on a silicon substrate 101. Trenches 101h are defined by a surface 101s of silicon substrate 101. Surface 101s contains an oxide layer 111, and a silicon oxide film 112 is formed on surface 101s. A polysilicon film 119 is filled into trenches 101h in such a manner that polysilicon film 119 is in contact with silicon oxide film 112, and an oxide layer 117 is so formed as to cover the surface of polysilicon film 119.

Between adjacent trenches 101h, floating gate electrodes 122 are arranged on silicon substrate 101 with a gate insulator film 121 disposed therebetween. Floating gate electrodes 122 are composed of a bottom conductor film 122a and a top conductor film 122b.

A silicon oxide film 123 is so laid as to be in contact with the side walls of lower conductor layer 122a and with gate insulator film 121. On silicon oxide film 123 is a side-wall insulator layer 124 made of a silicon nitride film.

Adjacent floating gates 122 are isolated from each other by trenches 101h formed therebetween.

A control gate electrode 131 is formed on floating gate electrodes 122 with a dielectric film 125 disposed therebetween. Control gate electrode 131 is extended from the right to the left side of the drawing.

A method for fabricating the semiconductor device of FIG. 11 will be described as follows. FIGS. 12 to 15 show cross sectional views depicting a method for fabricating the semiconductor device of FIG. 11. Referring to FIG. 12, gate insulator film 121 is formed on the surface of silicon substrate 101. A polysilicon film, a silicon oxide film, and a silicon nitride film are formed on gate insulator film 121 in this order. A patterned resist pattern is provided on the silicon nitride film. Then, the silicon nitride film, the silicon oxide film, and the polysilicon film are etched in accordance with the resist pattern. As a result, a silicon nitride film 127, a silicon oxide film 128, and lower conductor layer 122a are completed. While using silicon nitride film 127 and lower conductor layer 122a as a mask, impurity ions are implanted into silicon substrate 101, thereby forming impurity regions 116 as source and drain regions.

Referring to FIG. 13, silicon oxide film 123 and a silicon nitride film are accumulated on the surface of silicon substrate 101, and the entire surface of silicon substrate 101 is etched back so as to form side-wall insulator layer 124 and silicon oxide film 123. While using silicon nitride film 127 and side-wall insulator layer 124 as a mask, the entire surface of silicon substrate 101 is etched back so as to form trenches 101h. The surfaces of trenches 101h are oxidized to form an oxide layer 111.

Referring to FIG. 14, silicon oxide film 112 is formed by CVD (chemical vapor deposition), and polysilicon film 119 is accumulated on silicon oxide film 112. The entire surface of semiconductor substrate 1 is, etched back so as to expose silicon nitride film 127.

Referring to FIG. 15, the surface of polysilicon film 119 is oxidized to form oxide layer 117. Then, silicon nitride film 127 is eliminated.

Referring to FIG. 11, after the surface of lower conductor layer 122a is washed, a polysilicon film is formed. The polysilicon film is etched to form upper conductor layer 122b. On upper conductor layer 122b is formed dielectric film 125 made of an ONO (oxide nitride oxide) film composed of a silicon oxide film, a silicon nitride film, and another silicon oxide film. Control gate electrode 131 is arranged on dielectric film 125, thereby completing the semiconductor device shown in FIG. 11.

The problems of the aforementioned prior art semiconductor device will be described as follows with reference to the drawings.

FIG. 16 shows a cross sectional view depicting a problem of the prior art semiconductor device. Referring to FIG. 16, in a prior art process, silicon substrate 101 is exposed in an oxidizing atmosphere while oxide layer 117 is being formed. During the exposure, an oxygen gas permeates through silicon oxide film 112 and oxide layer 111 so as to reach silicon substrate 101. Consequently, the portions of silicon substrate 101 that are in contact with surface 101s are oxidized to become oxide layer 135. Oxide layer 135, which is larger in volume than silicon, causes crystal defects in its vicinity. The occurrence of such crystal defects in the channel portions under floating gate electrodes 122 makes arsenic in impurity regions 116 be captured by the crystal defects, which shortens the substantial channel length. Supplying a potential difference across adjacent impurity regions in the transistors will cause a current to flow continuously due to the punch through between the source and the drain. This causes a problem that a selected memory cell transistor malfunctions, thereby deteriorating the reliability of the semiconductor device. There is a similar problem in forming oxide films of dielectric film 125, which is an ONO film.

FIG. 17 is a cross sectional view depicting another problem of the prior art semiconductor device. Referring to FIG. 17, electrons usually travel in the direction indicated by an arrow 142 between the source and the drain. However, some of the electrons traveling from the source to the drain proceed in the direction indicated by an arrow 143 and are captured by the trap level in gate insulator film 121, which is referred to as a hot electron phenomenon. The phenomenon causes the threshold voltage of the transistors to fluctuate, thereby decreasing the reliability of the semiconductor device.

SUMMARY OF THE INVENTION

The present invention, which has been contrived to solve the aforementioned problems, has an object of providing a highly reliable semiconductor device.

The semiconductor device of the present invention includes a semiconductor substrate, a gate electrode, a side-wall insulator layer, and a nitrogen-containing layer. The semiconductor substrate includes a first surface and a second surface which is adjacent to the first surface and defines trenches. The gate electrode has side wall, and is formed on the first surface of the semiconductor substrate with a gate insulator film interposed therebetween. The side-wall insulator layer is formed on the side wall and on a portion of the first surface. The nitrogen-containing layer is so formed as to extend from the portion of the semiconductor substrate that is in the vicinity of second surface to the portion of the semiconductor substrate that is in the vicinity of the interface between the side-wall insulator layer and the semiconductor substrate. The nitrogen-containing layer has a higher concentration of nitrogen than the first surface of the semiconductor substrate under the gate electrode.

In the semiconductor device thus structured, the nitrogen-containing layer is so formed as to extend from the portion of the semiconductor substrate that is in the vicinity of the second surface defining the trench to the portion of the semiconductor substrate that is in the vicinity of the interface between the side-wall insulator layer and the semiconductor substrate. In this region, the presence of nitrogen in the semiconductor substrate protects the substrate from being oxidized. Consequently, the semiconductor substrate is prevented from increasing in volume, which eliminates the possibility of the occurrence of a crystal defect. Hence, a punch through phenomenon is prevented so as to provide a highly reliable semiconductor device. In addition, the formation of the nitrogen-containing layer in the portion of the semiconductor substrate that is in the vicinity of the interface between the side-wall insulator layer and the semiconductor substrate decreases the density of a trap level in the insulator layer formed in this region. This decrease suppresses the capture of electrons, so as to obtain a highly reliable semiconductor device. Moreover, the nitrogen-containing layer has a higher concentration of nitrogen than the first surface of the semiconductor substrate that is under the gate electrode, so that the concentration of nitrogen is low in the channel regions under the gate electrode. As a result, a highly reliable semiconductor device capable of preventing the fluctuation of the threshold value can be provided.

It is preferable that the semiconductor device further includes an impurity region formed in the portion of the semiconductor substrate that is under the side-wall insulator layer. In this case, the occurrence of a punch through across the impurity regions can be prevented, so as to provide a highly reliable semiconductor device.

It is preferable that the semiconductor device further includes a buried insulator layer to fill the trenches.

It is also preferable that the semiconductor device further includes a control gate electrode formed on the gate electrode with a dielectric film interposed therebetween. In this case, a highly reliable nonvolatile semiconductor storage device can be provided.

It is preferable that the gate electrode includes a lower conductor layer so formed as to be in contact with the gate insulator film, and a upper conductor layer formed on the lower conductor layer opposite to face the control gate electrode, and the upper conductor layer has a larger width than the lower conductor layer. In this case, the upper conductor layer having a larger width than the lower conductor layer increases the area in which the upper conductor layer faces the control gate electrode. As a result, the capacity between the control gate electrode and the upper conductor layer increases, thereby providing a nonvolatile semiconductor storage device capable of operating with less voltage supplied to the control gate electrode.

It is preferable that the semiconductor device further includes an oxide layer formed on the second surface. In this case, the oxide layer formed on the second surface prevents the occurrence of an interface level.

It is preferable that the oxide layer is formed between the nitrogen-containing layer and the second surface.

The method for fabricating the semiconductor device of the present invention includes the steps of: forming gate electrode having side wall on a first surface of a semiconductor substrate with a gate insulator film interposed therebetween; forming a side-wall insulator layer on the side wall of the gate electrode and on a portion of the first surface; forming a trench defined by a second surface in the semiconductor substrate by etching the semiconductor substrate using the gate electrode and the side-wall insulator layer as a mask; and forming a nitrogen-containing layer extending from the portion of the semiconductor substrate that is in the vicinity of the second surface to the portion of the semiconductor substrate that is in the vicinity of the interface between the side-wall insulator layers and the semiconductor substrate by maintaining the semiconductor substrate in an atmosphere containing either nitrogen or a nitrogen compound.

According to the method for fabricating the semiconductor device including the above-described steps, the nitrogen-containing layer is so formed as to extend from the portion of the semiconductor substrate that is in the vicinity of the second surface defining the trenches to the portion of the semiconductor substrate that is in the vicinity of the interface between the side-wall insulator layer and the semiconductor substrate. In this region, the presence of nitrogen in the semiconductor substrate protects the substrate from being oxidized. Consequently, the semiconductor substrate is prevented from increasing in volume, which eliminates the possibility of the occurrence of a crystal defect. Hence, the punch through phenomenon is prevented so as to provide a highly reliable semiconductor device. In addition, the formation of the nitrogen-containing layer in the portion of the semiconductor substrate that is in the vicinity of the interface between the side-wall insulator layer and the semiconductor substrate decreases the density of the trap level in the insulator layer formed in this region. This decrease suppresses the capture of electrons, thereby realizing a highly reliable semiconductor device. Moreover, the nitrogen-containing layer has a higher concentration of nitrogen than the first surface of the semiconductor substrate that is under the gate electrodes, so that the concentration of nitrogen is low in the channel regions under the gate electrodes. As a result, a highly reliable semiconductor device capable of preventing a fluctuation in threshold value can be provided.

It is preferable that the method for fabricating the semiconductor device further including the step of forming an oxide layer by oxidizing the second surface before forming the nitrogen-containing layer. In this case, the oxide layer prevents the occurrence of an interface level in the second surface.

It is preferable that the method for fabricating the semiconductor device further including the step of forming impurity regions in the portions of the semiconductor substrate that are at both sides of each of the gate electrode by implanting an impurity into the semiconductor substrate while using the gate electrode as a mask after the formation of the gate electrode and before the formation of the side-wall insulator layer. In this case, the punch through phenomenon across the impurity regions is prevented so as to provide a highly reliable semiconductor device.

It is preferable that the method for fabricating the semiconductor device further includes the step of forming a buried insulator layer to fill the trench after the formation of the nitrogen-containing layer.

In addition, maintaining the semiconductor substrate in the atmosphere containing either nitrogen or the nitrogen compound includes maintaining the semiconductor substrate in an atmosphere of nitric oxide. In this case, the present of nitric oxide further decreases crystal defects in the side-wall insulator film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
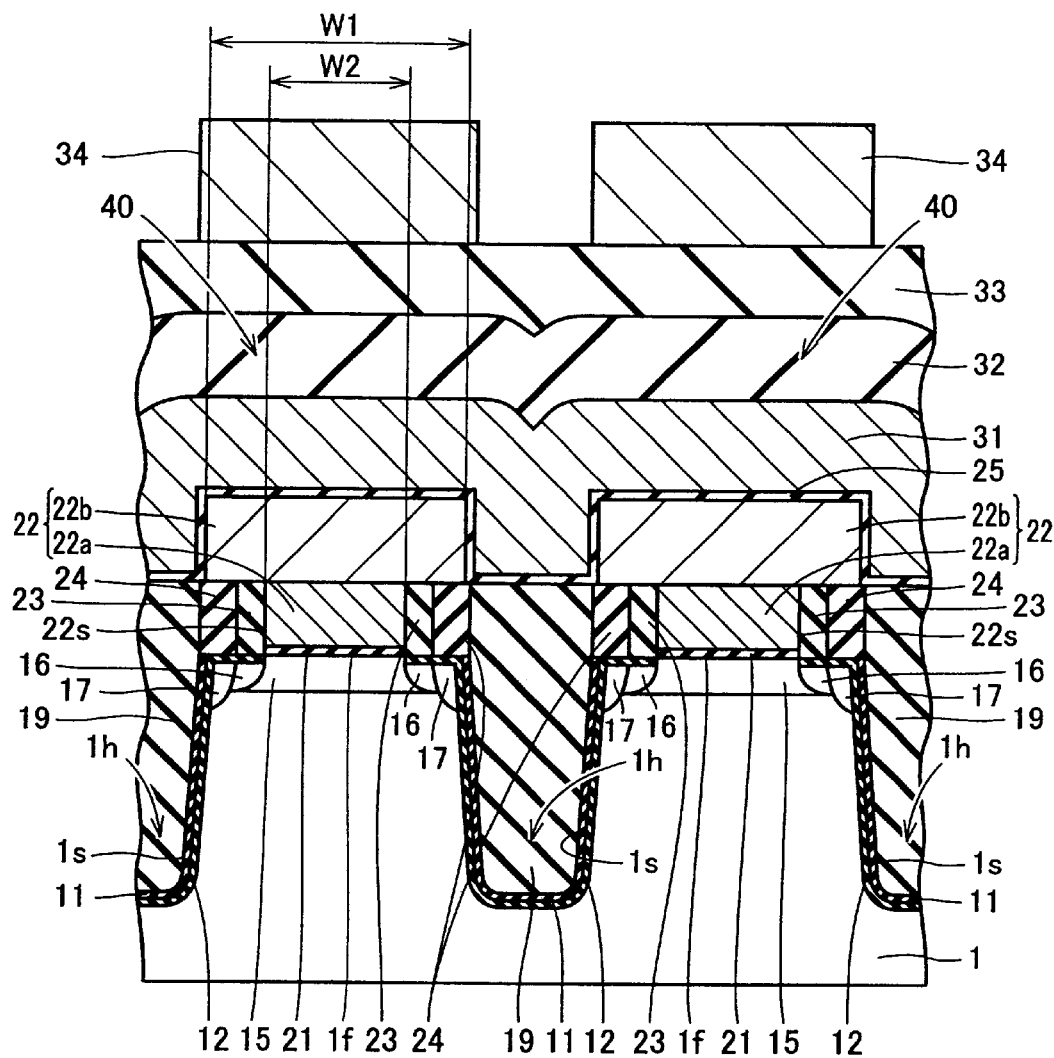
FIG. 1 shows a cross sectional view of the semiconductor device of a first embodiment of the present invention.

The embodiments of the present invention will be described as follows referring to the drawings.

First Embodiment

Referring to FIG. 1, the semiconductor device of the first embodiment is an EEPROM (electrically erasable programmable read-only memory) as a nonvolatile semiconductor storage device. To be more specific, the device is a flash memory including a silicon substrate 1 as a semiconductor substrate including a first surface 1f and a second surface 1s which is adjacent to first surface 1f and defines trenches 1h as ditches, floating gate electrodes 22 which are formed on first surface 1f of silicon substrate 1 with a gate insulator film 21 disposed therebetween and which are formed as gate electrodes with side walls 22s, a first side-wall insulator layer 23 and a second side-wall insulator layer 24 which are formed on side walls 22s and on a portion of first surface 1f, and a nitrogen-containing layer 12 so formed as to extend from the portion of silicon substrate 1 that is in the vicinity of second surface 1s to the portion of silicon substrate 1 that is in the vicinity of the interface between first and second side-wall insulator layers 23, 24 and silicon substrate 1. Nitrogen-containing layer 12 has a higher concentration of nitrogen than first surface 1f of silicon substrate 1 that is under floating gate electrodes 22.

The semiconductor device further includes low-concentration impurity regions 16 and high-concentration impurity regions 17 as impurity regions formed in the portions of silicon substrate 1 that are under first and second side-wall insulator layers 23, 24, respectively. The semiconductor device further includes a buried insulator layer 19 formed in trenches 1h.

The semiconductor device further includes a control gate electrode 31 formed on floating gate electrodes 22 with a dielectric film 25 disposed therebetween.

Floating gate electrodes 22 includes a lower conductor layer 22a formed to be in contact with gate insulator film 21, and a upper conductor layer 22b formed on lower conductor layer 22a so as to face control gate electrode 31. A width W1 of upper conductor layer 22b is larger than a width W2 of lower conductor layer 22a.

The semiconductor device further includes an oxide layer 11 formed on second surface 1s. Oxide layer 11 is formed between nitrogen-containing layer 12 and second surface 1s.

First surface 1f of silicon substrate 1 is approximately flat, and second surface 1s defining the ditches is formed to be adjacent to first surface 1f. Second surface 1s is extended from first surface 1f into the inside of silicon substrate 1.

Trenches 1h are defined by second surface 1s. Trenches 1h are so formed as to extend from the front towards the back on the drawing, and the depth and the width can be set at appropriate values.

Silicon substrate 1 defining second surface 1s contains oxide layer 11 formed as a result of oxidization of silicon substrate 1. Nitrogen-containing layer 12 is so formed as to be in contact with oxide layer 11, and has a higher percentage of nitrogen content than oxide layer 11. In other words, the nitrogen content decreases from nitrogen-containing layer 12 towards oxide layer 11. On the other hand, the oxygen content increases from nitrogen-containing layer 12 towards oxide layer 11. Nitrogen-containing layer 12 is formed not only in the vicinity of second surface 1s but also in the vicinity of first surface 1f. Nitrogen-containing layer 12 is formed in the region other than the region just under lower conductor layer 22a which is a component of floating gate electrodes 22. A silicon oxide nitride film is formed in the vicinity of the interface between nitrogen-containing layer 12 and oxide layer 11.

Gate insulator film 21 made of a silicon oxide film is formed on first surface 1f. On gate insulator film 21 is formed lower conductor layer 22a which is a component of floating gate electrodes 22. Lower conductor layer 22a is made from a conductive material such as doped polysilicon. Lower conductor layer 22a has side walls 22s, and first side-wall insulator layer 23 is so formed as to be in direct contact with side walls 22s. Second side-wall insulator layer 24 is so formed as to be in contact with first side-wall insulator layer 23.

Beneath gate insulator film 21 are formed channel dope regions 15 in order to control a threshold value. In channel dope regions 15, boron is implanted as a p-type impurity.

A pair of low-concentration impurity regions 16 are formed separately from each other at both sides of each of channel dope regions 15 and under first side-wall insulator layer 23. In low-concentration impurity regions 16, arsenic is implanted as an n-type impurity. A pair of high-concentration impurity regions 17 are formed separately from each other at both sides of each pair of low-concentration impurity regions 16 and under second side-wall insulator layer 24. In high-concentration impurity regions 17, arsenic is implanted as an n-type impurity. High-concentration impurity regions 17 contain a higher concentration of arsenic than low-concentration impurity regions 16.

A buried insulator layer 19 made of a silicon oxide is formed in such a manner as to fill trenches 1h and to be in contact with second side-wall insulator layer 24. Buried insulator layer 19 electrically isolates adjacent memory cell transistors 40.

Upper conductor layer 22b is formed on lower conductor layer 22a and on first and second side-wall insulator layers 23 and 24. Upper conductor layer 22b is made from a conductive material such as a doped polysilicon. In order to expand the area in which upper conductor layer 22b faces control gate electrode 31, thereby increasing the capacity of upper conductor layer 22b, its width W1 is made larger than width W2 of lower conductor layer 22a.

Dielectric film 25 is formed directly on upper conductor layer 22b. Dielectric film 25 has a three-layer structure, or is a so-called ONO film composed of a silicon oxide film, a silicon nitride film, and another silicon oxide film.

Control gate electrode 31 is arranged on dielectric film 25 in such a manner as to be extended in the direction orthogonal to the direction in which trenches 1h are extended, that is, from the right to the left side in the drawing. Control gate electrode 31 is a so-called word line.

Silicon oxide films 32 and 33, which are interlevel insulator films, are formed on control gate electrode 31. Silicon oxide film 33 is doped with boron and phosphorus in order to improve the flatness. A wiring layer 34 made from an aluminum alloy is arranged on silicon oxide film 33.

Figure 2:
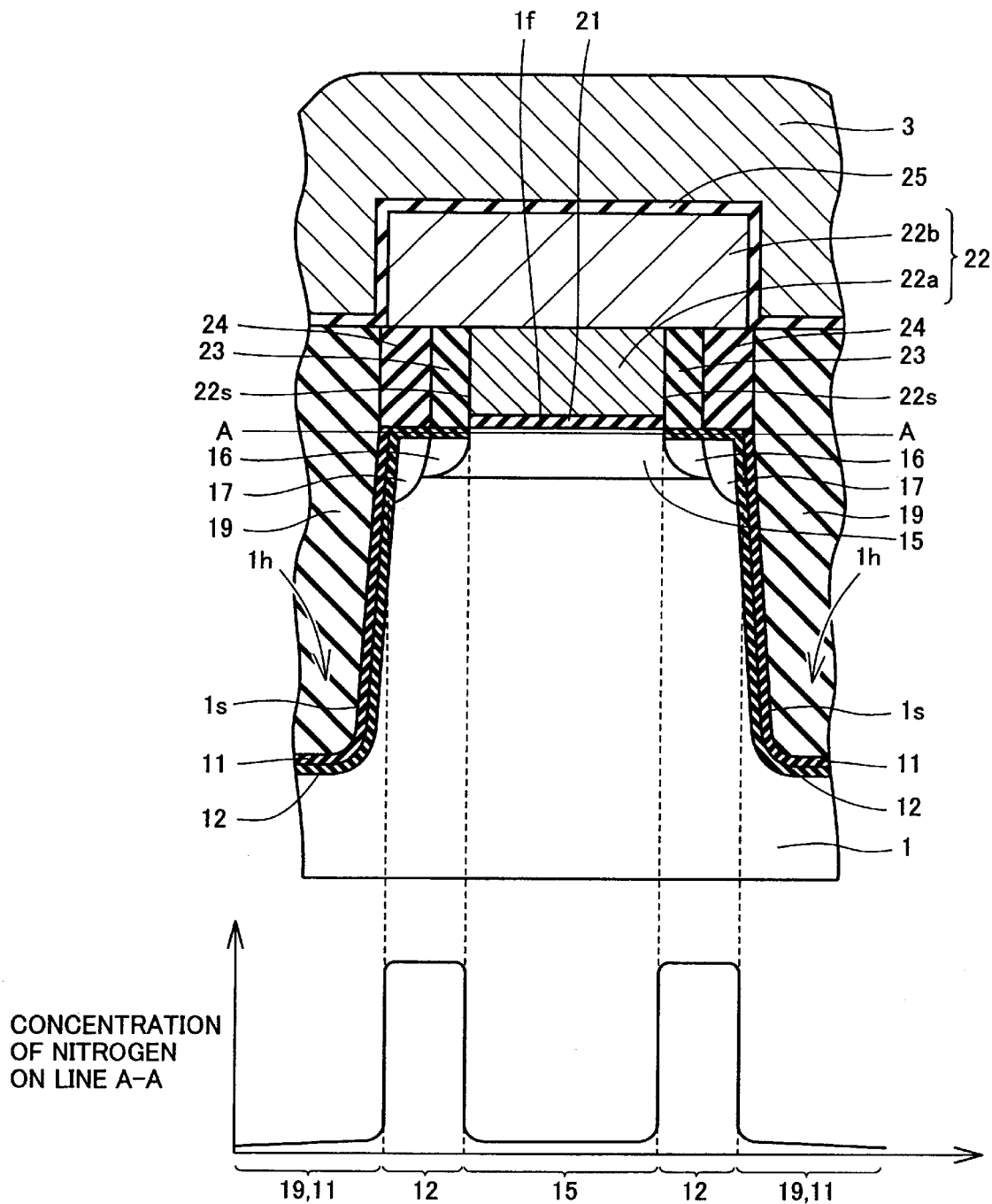
FIG. 2 is a graph showing the distribution of the concentration of nitrogen on line A—A in FIG. 2.

Referring to FIG. 2, the concentration of nitrogen on line A—A becomes comparatively higher in nitrogen-containing layer 12 and becomes comparatively lower in the other region. To be more specific, nitrogen-containing layer 12 illustrated in FIG. 2 has a higher concentration of nitrogen than first surface 1f of silicon substrate 1 that faces lower conductor layer 22a of floating gate electrodes 22. Thus, nitrogen-containing layer 12 has a higher concentration of nitrogen than any of channel dope regions 15, oxide layer 11, and buried insulator layer 19.

A method for fabricating the semiconductor device shown in FIG. 1 will be described as follows.

Figure 3:
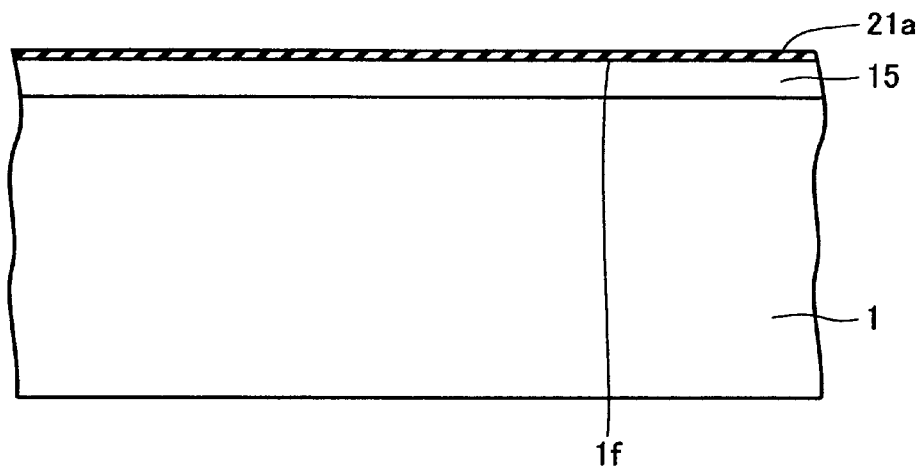
FIGS. 3 to 10 show cross sectional views depicting the first-eighth processes in the method for fabricating the semiconductor device shown in FIG. 1.

Referring to FIG. 3, a surface (001) of p-type silicon substrate 1 is first surface 1f, and a 10 nm-thick silicon oxide film 21a is formed on first surface 1f by a thermal oxidation process. Then, boron ions are implanted with an implantation energy of 20 keV and an implantation amount of $1\times10^{13}$ $cm^{-2}$ into the region where memory cell transistors 40 are formed so as to form channel dope regions 15.

Figure 4:
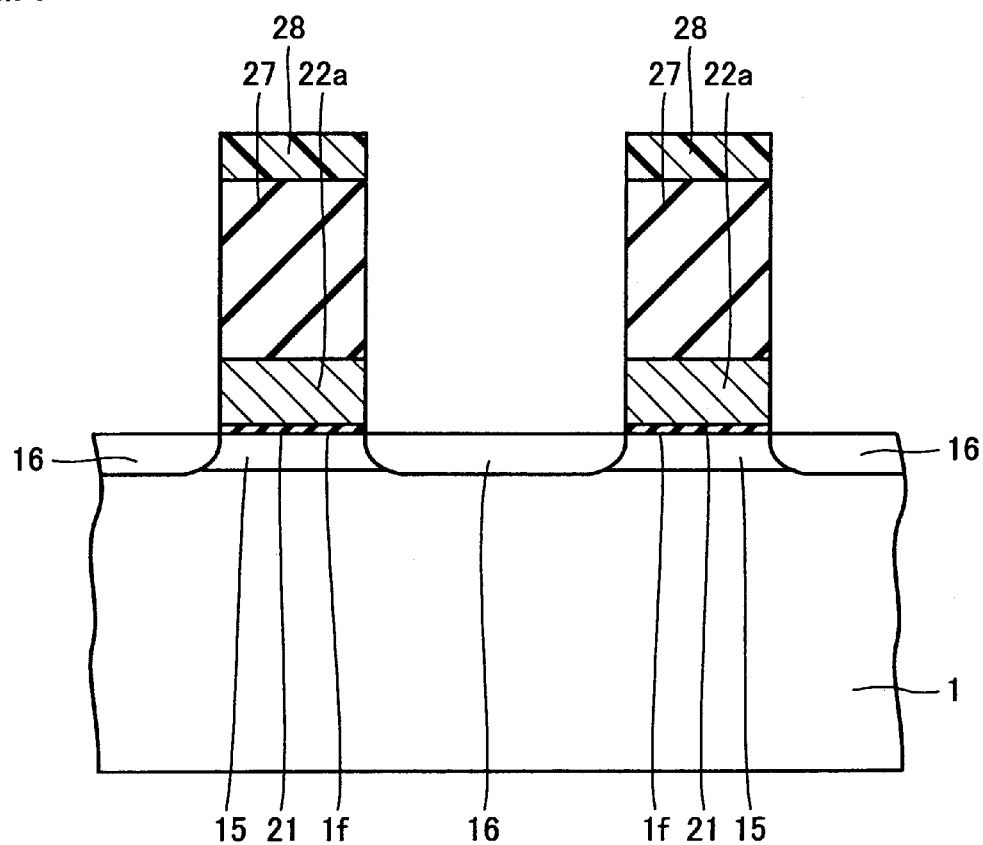

Referring to FIG. 4, after silicon oxide film 21a is removed by a solution of fluoric acid, gate insulator film 21 made of a 10 nm-thick silicon oxide film is grown on first surface 1f of silicon substrate 1 by the thermal oxidation process. Then, a 100 nm-thick doped polysilicon film doped with phosphorus is formed by a low pressure CVD, and a 200 nm-thick silicon nitride film is accumulated thereon by the low pressure CVD. A resist pattern 28 is formed on the silicon nitride film, and the silicon nitride film is etched by using resist pattern 28 as a mask so as to form a silicon nitride film 27 with a small width. After resist pattern 28 is removed, the doped polysilicon is patterned by using silicon nitride film 27 as a mask so as to form lower conductor layer 22a having side walls 22s.

While using lower conductor layer 22a and silicon nitride film 27 as a mask, arsenic is implanted with an implantation energy of 40 keV and an implantation amount of $5\times10^{13}$ $cm^{-2}$ into first surface 1f of silicon substrate 1. Thus, low-concentration impurity regions 16 of the memory cell transistors are completed.

Figure 5:
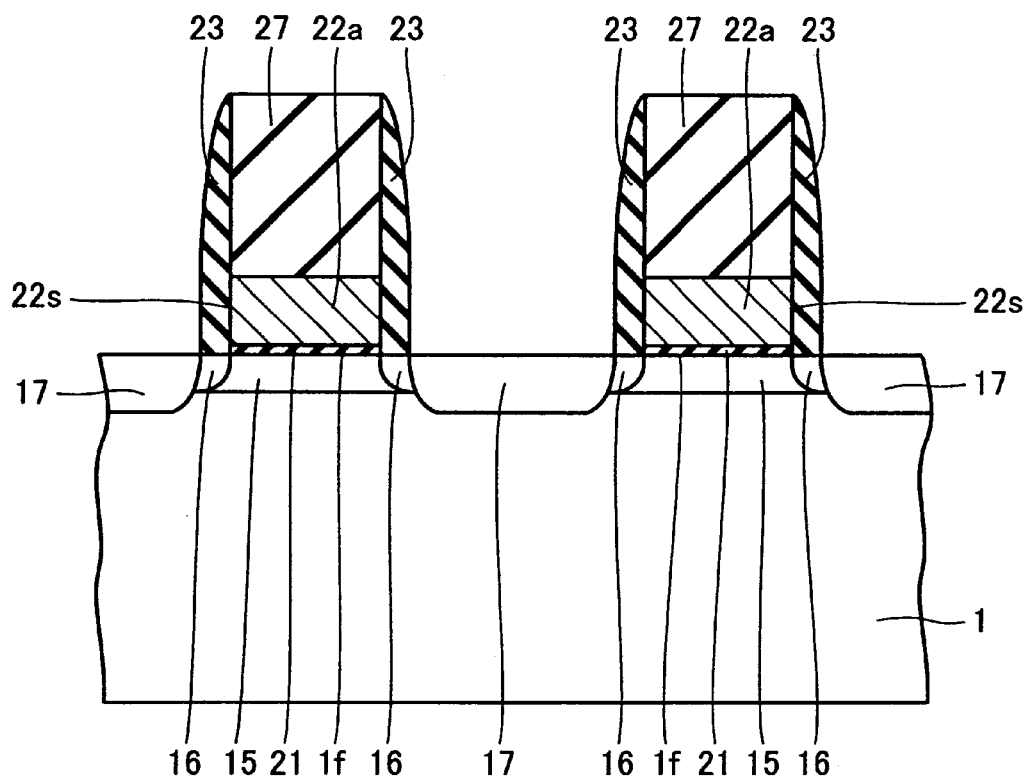

Referring to FIG. 5, a 150 nm-thick silicon oxide film is accumulated by the low pressure CVD. The entire surface of the silicon oxide film is etched back so as to form first side-wall insulator layer 23. While using silicon nitride film 27 and first side-wall insulator layer 23 as a mask, arsenic is implanted with an implantation energy of 40 keV and an implantation amount of $4\times10^{15}$ $cm^{-2}$ into first surface 1f of silicon substrate 1. Thus, high-concentration impurity regions 17 of the memory cell transistors are completed.

Figure 6:
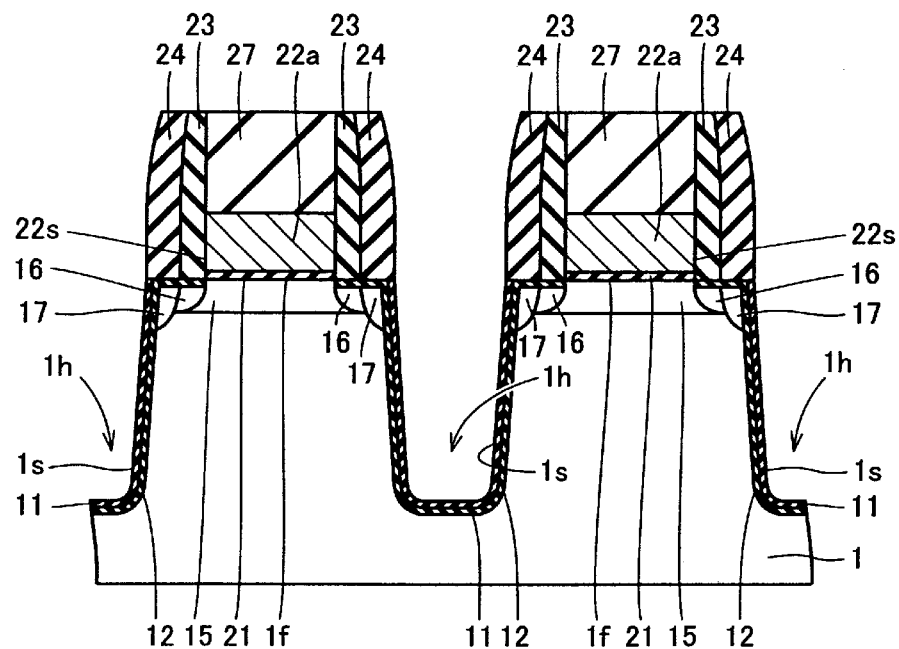

Referring to FIG. 6, a 150 nm-thick silicon oxide film is accumulated on first side-wall insulator layer 23 by the low pressure CVD. The silicon oxide film is etched back so as to form second side-wall insulator layer 24. While using silicon nitride film 27 and first and second side-wall insulator layers 23, 24 as a mask, the surface of silicon substrate 1 is etched. Consequently, 400 nm-deep trenches 1h defined by second surface 1s are formed. Second surface 1s of trenches 1h is subjected to thermal oxidation so as to form 10 nm-thick oxide layer 11.

Silicon substrate 1 is maintained in an atmosphere consisting of a nitric oxide (NO) gas of 15% by volume and a nitrogen ($N_2$) gas of 85% by volume at a temperature of 900° C., so that nitrogen-containing layer 12 can be formed on second surface 1s and on a portion of first surface 1f. In this case, nitrogen reaches silicon substrate 1 by permeating through oxide layer 11 or the like, which makes nitrogen-containing layer 12 be formed on the inner side of oxide layer 11. Furthermore, nitrogen also reaches the portion of silicon substrate 1 that is under first and second side-wall insulator layers 23, 224 by permeating through the silicon oxide film composing first and second side-wall insulator layers 23, 24. Thus, nitrogen-containing layer 12 is formed in the portion. In contrast, nitrogen hardly permeates through the doped polysilicon composing lower conductor layer 22a, so that nitrogen-containing layer 12 is not formed under lower conductor layer 22a.

Figure 7:
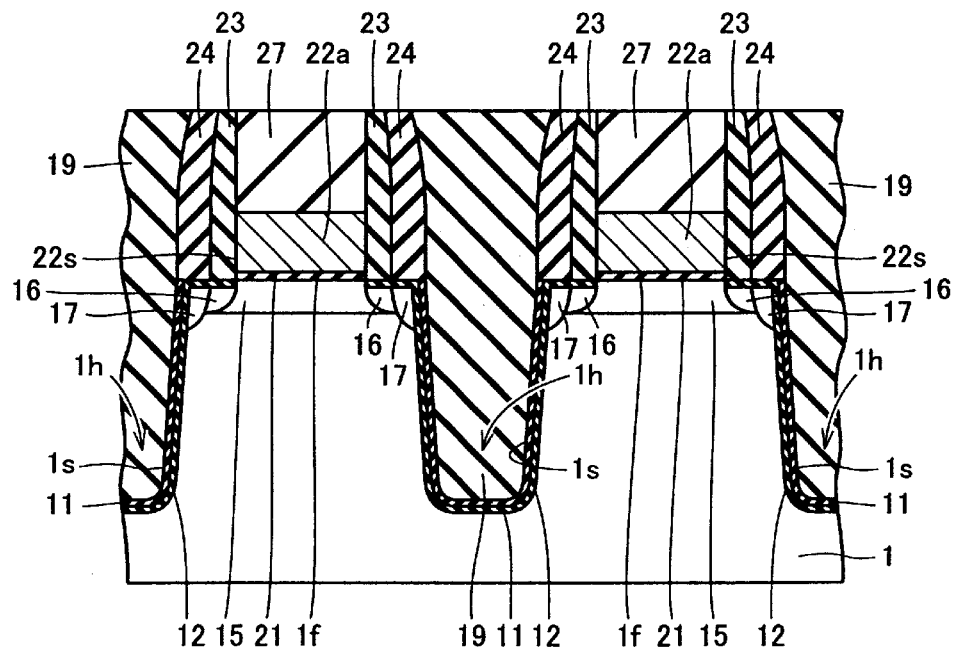

Referring to FIG. 7, buried insulator layer 19 having a thickness of 800 nm and is made of a silicon oxide film is accumulated by a CVD in such a manner as to fill trenches 1h. The surface of the thick silicon oxide film is polished by CMP (chemical-mechanical polishing), and the silicon oxide film is etched by a predetermined amount with the use of fluoric acid (HF) so as to expose the surface of silicon nitride film 27.

Figure 8:
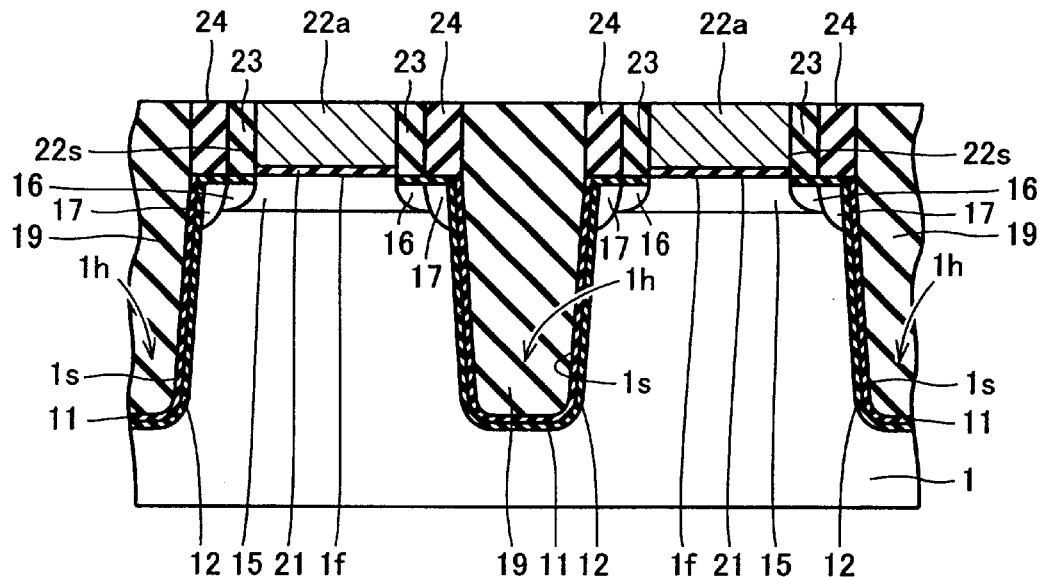

Referring to FIG. 8, silicon nitride film 27 is removed using a thermal phosphoric acid. A portion of buried insulator layer 19 made of a silicon oxide film is etched using a solution of fluoric acid.

Figure 9:
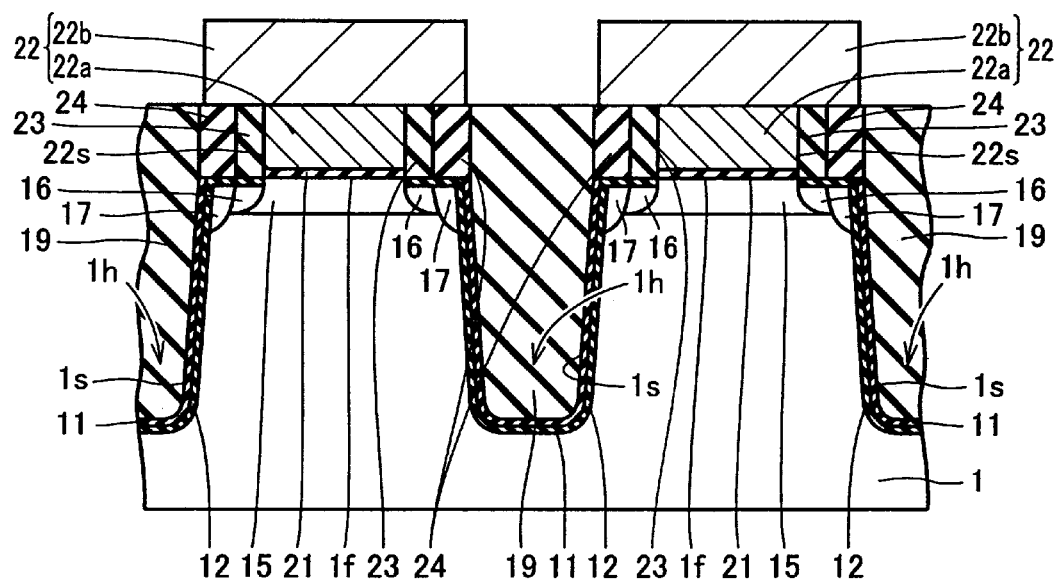

Referring to FIG. 9, a doped polysilicon film doped with phosphorus is accumulated as thick as 200 nm on lower conductor layer 22a, on first and second side-wall insulator layers 23, 24, and on buried insulator layer 19. A resist pattern is formed on the doped polysilicon film, and the doped polysilicon film is etched using the resist pattern as a mask so as to form upper conductor layer 22b. Later, the resist pattern is removed.

Figure 10:
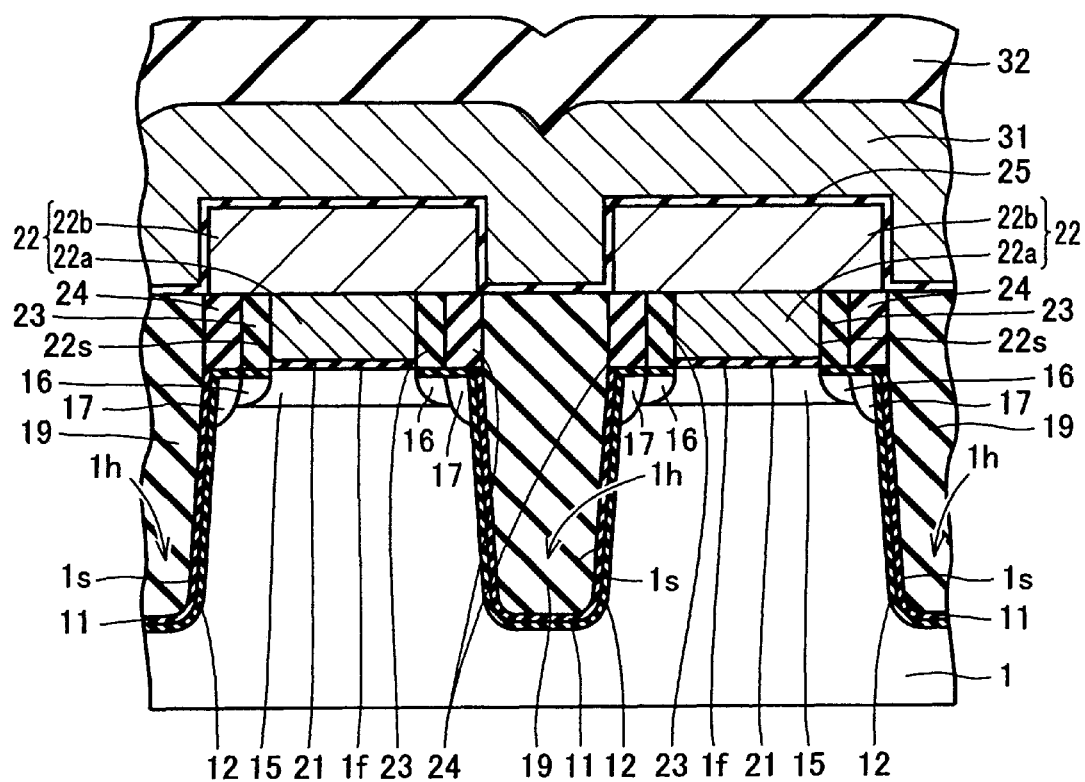
Figure 11:
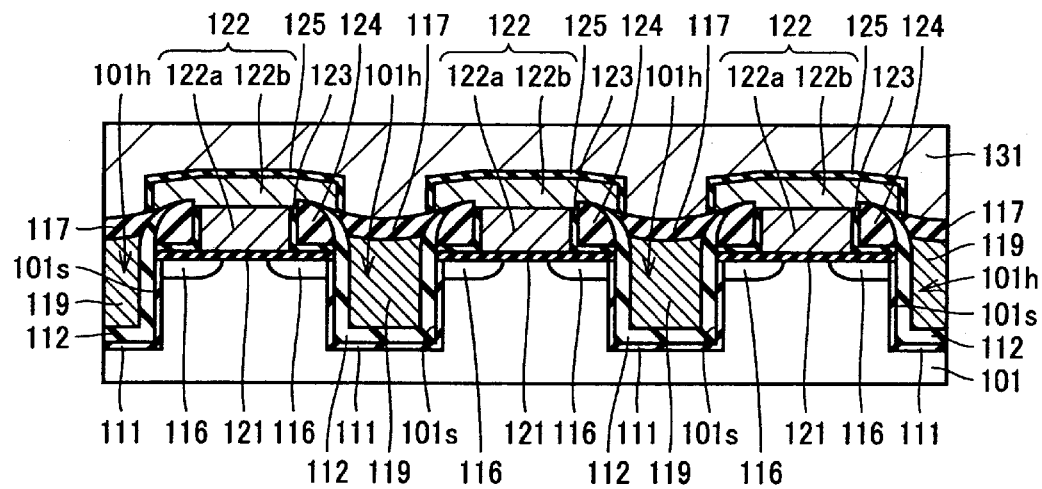
FIG. 11 shows a cross sectional view of the prior art semiconductor device.
Figure 12:
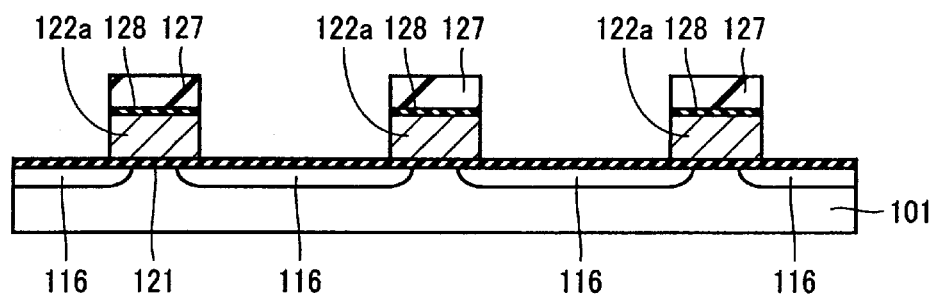
FIGS. 12 to 15 show cross sectional views depicting the first-fourth processes in the method for fabricating the semiconductor device shown in FIG. 11.
Figure 13:
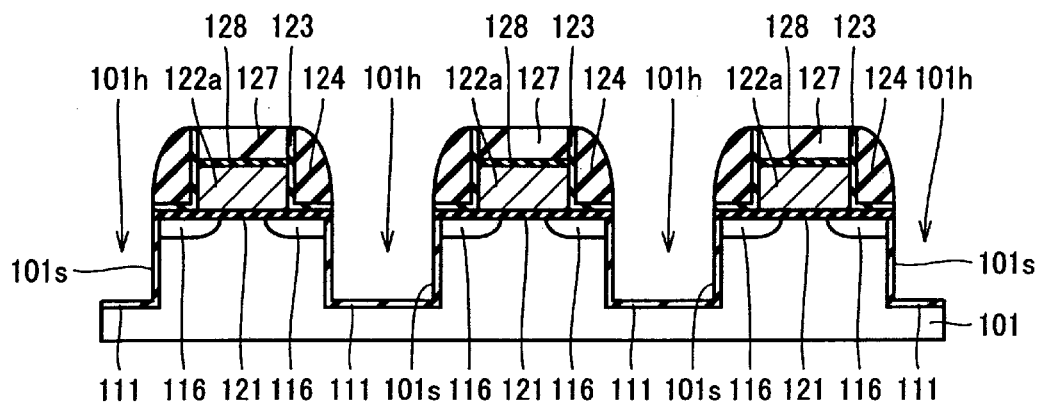
Figure 14:
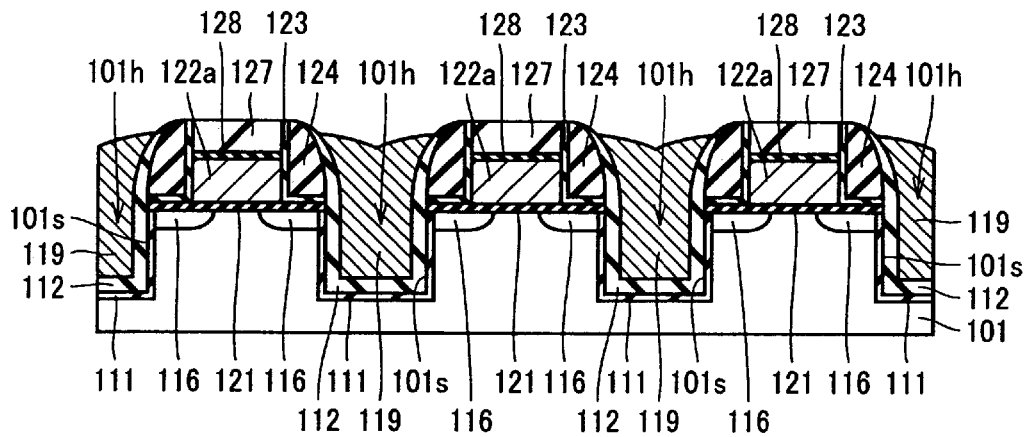
Figure 15:
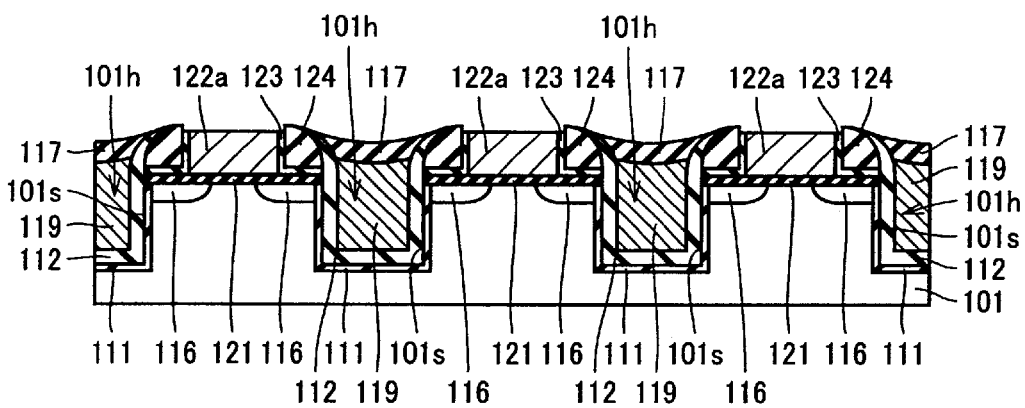
Figure 16:
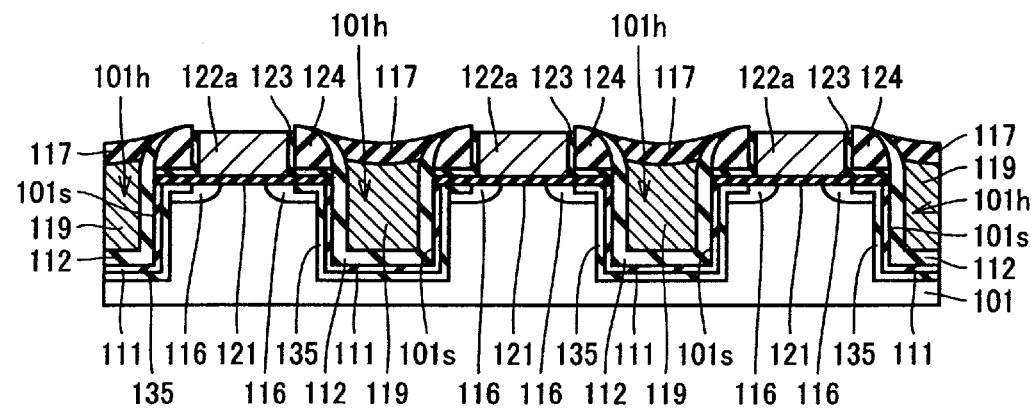
FIG. 16 shows a cross sectional view to explain a problem of the prior art semiconductor device.
Figure 17:
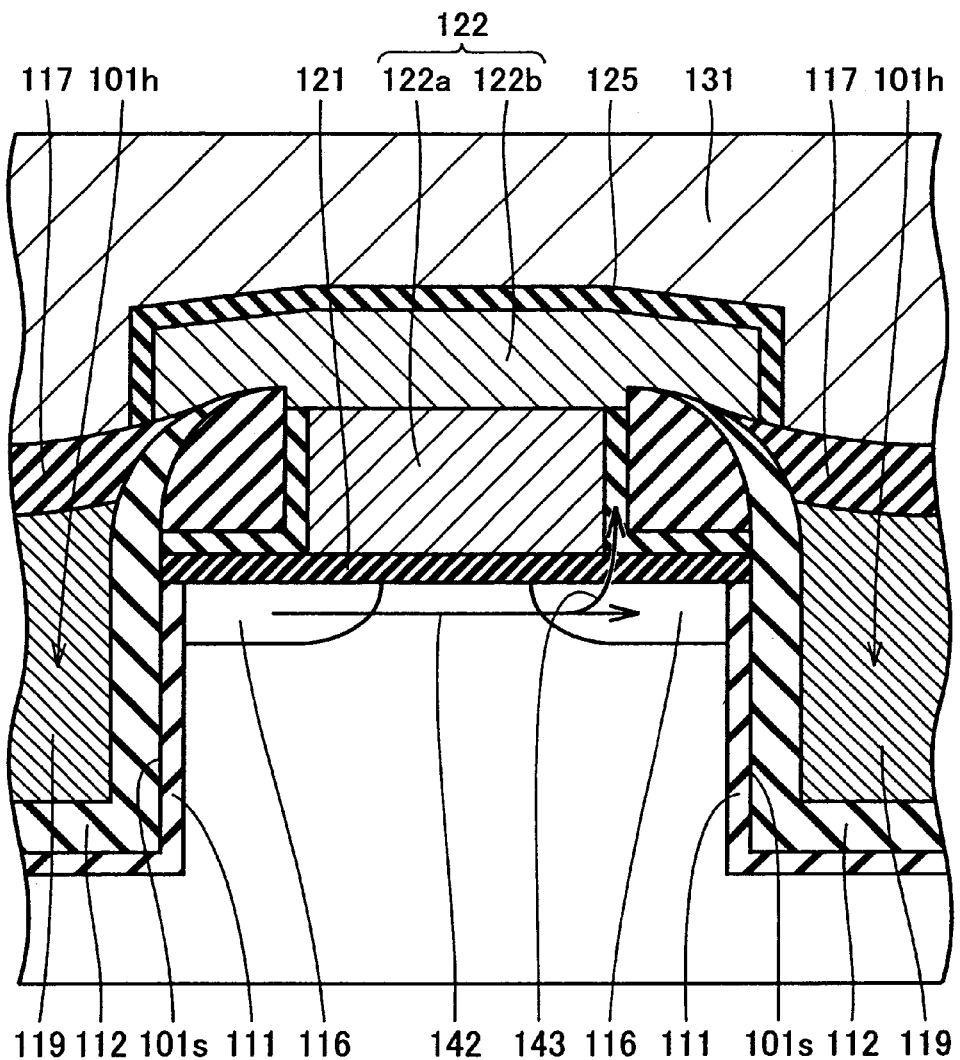
FIG. 17 shows a cross sectional view to explain another problem of the prior art semiconductor device.

Referring to FIG. 10, dielectric film (ONO film) 25 consisting of a 5 nm-thick silicon oxide film, a 10 nm-thick silicon nitride film, and a 5 nm-thick silicon oxide film is formed by the low pressure CVD. A 200 nm-thick doped polysilicon doped with phosphorus and a 220 nm-thick silicon oxide film 32 are accumulated by the low pressure CVD. A resist pattern is formed on silicon oxide film 32, and silicon oxide film 32 is etched according to the resist pattern so as to remove the resist pattern. While using silicon oxide film 32 patterned by etching as a mask, the doped polysilicon is etched to form control gate electrode (ward line) 31. While using silicon oxide film 32 as a mask, upper conductor layer 22b and lower conductor layer 22a are etched.

Referring to FIG. 1, a 500 nm-thick silicon oxide film 33 is accumulated on silicon oxide film 32 by the CVD. Silicon oxide film 33 is so-called boron-phosphorus glass. After silicon oxide film 33 is baked in a 30-minute thermal treatment at 850° C. in an oxygen atmosphere, a predetermined resist pattern is formed on silicon oxide film 33 by photolithography. After silicon oxide film 33 is etched to from a contact hole (not illustrated) while using a resist pattern as a mask., an aluminum-silicon-copper (Al—Si—Cu) alloy film is formed by sputtering. A predetermined resist pattern is formed on the aluminum-silicon-copper alloy film, and the alloy film is etched according to the resist pattern so as to form a wiring layer 34. Thus, the semiconductor device shown in FIG. 1 is completed.

In such a nonvolatile semiconductor storage device, memory transistors 40 store data as to whether electrons are implanted into floating gate electrodes 22 or released. When the electrons are implanted into floating gate electrodes 22, the threshold voltage of memory cell transistors 40 becomes a high value Vthp, which is referred to as a written condition. The stored electrons will not disappear almost indefinitely if nothing is done, so that the stored data will be also maintained almost indefinitely.

When the electrons are released from floating gate electrodes 22, the threshold voltage of memory cell transistors 40 becomes a low value Vthe, which is referred to as a vanished condition. Detecting these two conditions makes it possible to read data stored in memory cell transistors 40.

In the written condition, a high voltage Vpp (normally around 20 V) is supplied to control gate electrode 31. High-concentration impurity regions 17 and silicon substrate 1 are made to have a ground potential. This makes electrons be generated in the channel regions under floating gate electrodes 22, and implanted into floating gate electrodes 22 by tunneling through the energy barrier of gate insulator film 21. As a result, the threshold voltage of memory cell transistors 40 increases.

In the vanished condition, a high voltage Vpp (normally around −20 V) is supplied to control gate electrode 31. High-concentration impurity regions 17 and silicon substrate 1 are made to have a ground potential. This makes floating gate electrodes 22 release electrons towards silicon substrate 1 due to a tunnel phenomenon, thereby decreasing the threshold voltage of memory cell transistors 40.

In the readout operation of selected memory cell transistors 40, control gate electrode 31 and the drain (one of high-concentration impurity regions 17) are each supplied with a voltage of 3.3 V (Vcg=3.3 V). The source region (the other one of high-concentration impurity regions 17) and silicon substrate 1 are made to have a ground potential. Assuming that Vthe<3.3V<Vthp, no current flows between the source and the drain of memory cell transistors 40 in the written condition, whereas in the vanished condition, a current flows between the source and the drain.

In readout operation, in memory cell transistors 40 not selected, control gate electrode 31 is grounded (Vcg=0V), the drain region (one of high-concentration impurity regions 17) is supplied with a voltage of 3.3 V, and the source region (the other one of high-concentration impurity regions 17) and silicon substrate 1 are made to have a ground potential. Assuming that 0V<Vthe<Vthp, no current flows between the source and the drain of memory cell transistors 40 at Vcg=0 V.

A current flows between the source and the drain only in selected memory cell transistors 40 that are in the vanished condition, out of all memory cell transistors 40. Thus, data in each memory cell are detected.

In the semiconductor device of the present invention, nitrogen-containing layer 12 with a high concentration of nitrogen is formed in the vicinity of second surface 1s of trenches 1h. Since nitrogen-containing layer 12 blocks the permeation of oxygen through it, silicon substrate 1 is prevented from being oxidized in the oxidizing process after the formation of nitrogen-containing layer 12. Consequently, silicon substrate 1 does not swell, causing no stress inside it. This can prevent the occurrence of crystal defects in silicon substrate 1, thereby preventing the channel length of memory cell transistors 40 from decreasing. As a result, a source-drain punch through can be prevented so as to realize a highly reliable semiconductor device.

In addition, the formation of nitrogen-containing layer 12 by nitriding the interface between first and second side-wall insulator layers 23, 24 and silicon substrate 1 decreases the density of trap level at the interface. The decrease in the density prevents electrons from being captured in the interface, thereby providing memory cell transistors 40 having little fluctuation in threshold voltage.

Nitrogen is not implanted very much into the channel regions under floating gate electrodes 22, which prevents the threshold value from fluctuating, and boron in channel dope regions 15 from becoming inert.

The embodiments of the present invention have been described hereinbefore; however, these embodiments can be modified variously. First, as a method for forming nitrogen-containing layer 12, either an ammonia gas ($NH_3$) or dinitrogen oxide ($N_2O$) can be used in place of nitric oxide used in the above-mentioned mixture gas consisting of a nitric oxide gas and a nitrogen gas. Besides the thermal nitriding method, a nitriding method with the use of $N_2$, NO, or $NH_3$ plasma can be adopted.

The thickness of nitrogen-containing layer 12 can be varied as needed. Floating gate electrodes 22 have a two-layer structure consisting of lower conductor layer 22a and upper conductor layer 22b; instead, they may have a single-layer structure. Moreover, the present invention can be applied to a DRAM (dynamic random access memory), a SRAM (static random access memory), or the like, besides the above-mentioned nonvolatile semiconductor storage device.

In accordance with the present invention, a highly reliable semiconductor device can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate including a first surface and a second surface which is continuing to said first surface and defines a trench;
   a gate electrode with a side wall, said gate electrode being formed on said first surface of said semiconductor substrate with a gate insulator film interposed therebetween;
   a side-wall insulator layer formed on said side wall and on a portion of said first surface; and
   a nitrogen-containing layer so formed as to extend from a portion of said semiconductor substrate on the second surface to a portion of said semiconductor substrate on the first surface between said side-wall insulator layer and said semiconductor substrate wherein,
   said nitrogen-containing layer has a higher concentration of nitrogen than said first surface of said semiconductor substrate under said gate electrode.

2. The semiconductor device according to claim 1, further comprising an impurity region formed in a portion of said semiconductor substrate that is under said side-wall insulator layer.

3. The semiconductor device according to claim 1, further comprising a buried insulator layer filled into said trench.

4. The semiconductor device according to claim 1, further comprising a control gate electrode formed on said gate electrode with a dielectric film interposed therebetween.

5. The semiconductor device according to claim 4, wherein said gate electrode include a lower conductor layer so formed as to be in contact with said gate insulator film, and an upper conductive layer formed on said lower conductor layer opposite to said control gate electrode, and said upper conductor layer has a larger width than said lower conductor layer.

6. The semiconductor device according to claim 1, further comprising an oxide layer formed on said second surface.

7. The semiconductor device according to claim 6, wherein said oxide layer is formed between said nitrogen-containing layer and said second surface.

* * * * *